US010142052B2

(12) United States Patent
Milesi et al.

(10) Patent No.: US 10,142,052 B2
(45) Date of Patent: *Nov. 27, 2018

(54) METHODS AND APPARATUS FOR COMMUNICATION OVER AN ISOLATION BARRIER WITH MONITORING

(71) Applicant: Allegro MicroSystems, LLC, Worcester, MA (US)

(72) Inventors: Alejandro Gabriel Milesi, Buenos Aires (AR); Guillermo Stuarts, Buenos Aires (AR); Juan Guido Salaya, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/909,178

(22) Filed: Mar. 1, 2018

(65) Prior Publication Data

US 2018/0262297 A1    Sep. 13, 2018

Related U.S. Application Data

(63) Continuation of application No. 15/453,034, filed on Mar. 8, 2017, now Pat. No. 9,941,999.

(51) Int. Cl.
*H04B 3/00* (2006.01)
*H04L 25/00* (2006.01)
(Continued)

(52) U.S. Cl.
CPC ............ *H04L 1/0036* (2013.01); *G01R 29/02* (2013.01); *H04L 25/0268* (2013.01); *H04L 25/08* (2013.01); *H04L 25/49* (2013.01)

(58) Field of Classification Search
CPC ............. H04B 2203/5483; H04B 3/56; H04B 2203/5491; H04B 3/542; H04L 25/0266;
(Continued)

(56) References Cited

U.S. PATENT DOCUMENTS 3,624,529 A    11/1971    Gebelein, Jr.
3,691,305 A    9/1972    Huebner et al.
(Continued)

FOREIGN PATENT DOCUMENTS

WO    WO 98/37672    8/1998
WO    WO 99/21332    4/1999

OTHER PUBLICATIONS

U.S. Appl. No. 15/453,034, filed Mar. 8, 2017, Milesi et al.
(Continued)

*Primary Examiner* — James M Perez
(74) *Attorney, Agent, or Firm* — Daly, Crowley Mofford & Durkee, LLP

(57) ABSTRACT

Methods and apparatus embodiments to communicate data via a digital isolator by receiving an input data stream having first and second states, generating a first pulse train for the first state and a second pulse train for the second state. The first and second pulse types are transmitted across a voltage barrier of a digital signal isolator and received by a receive channel. The first and second pulse trains are processed to recover the input data stream in an output data stream. Data/System integrity functionality can identify fault conditions from an alteration of transmitted pulses.

80 Claims, 11 Drawing Sheets

(51) Int. Cl.
  *H04L 1/00* (2006.01)
  *G01R 29/02* (2006.01)
  *H04L 25/02* (2006.01)
  *H04L 25/08* (2006.01)
  *H04L 25/49* (2006.01)

(58) Field of Classification Search
  CPC ............... H04L 27/2647; H04L 5/0007; H04L 27/2657; H04L 27/2662; H04L 5/0048
  USPC ................ 375/219–223, 237–239, 256–260, 375/354–361
  See application file for complete search history.

(56) References Cited

U.S. PATENT DOCUMENTS

| | | | |
|---|---|---|---|
| 5,077,486 A | 12/1991 | Marson et al. | |
| 5,574,396 A | 11/1996 | Drainville | |
| 6,220,552 B1 | 4/2001 | Ireland | |
| 6,323,796 B1* | 11/2001 | Krone | H04L 25/0266 341/143 |
| 6,385,235 B1* | 5/2002 | Scott | H04L 25/0266 375/220 |
| 6,456,712 B1* | 9/2002 | Hein | H04L 25/0266 379/399.01 |
| 7,082,171 B1 | 7/2006 | Johnson et al. | |
| 7,259,545 B2* | 8/2007 | Stauth | G01R 15/205 324/117 H |
| 7,335,199 B2 | 2/2008 | Goble et al. | |
| 7,518,354 B2* | 4/2009 | Stauth | G01R 15/205 324/117 H |
| 7,590,334 B2 | 9/2009 | Yabusaki et al. | |
| 7,746,056 B2* | 6/2010 | Stauth | G01R 15/205 324/117 R |
| 7,747,146 B2 | 6/2010 | Milano et al. | |
| 7,768,083 B2* | 8/2010 | Doogue | B82Y 25/00 257/422 |
| 7,973,527 B2* | 7/2011 | Taylor | B82Y 25/00 324/117 R |
| 8,063,634 B2* | 11/2011 | Sauber | B82Y 25/00 324/244 |
| 8,216,220 B2* | 7/2012 | Jensen | A61B 18/1206 375/238 |
| 8,353,905 B2* | 1/2013 | Jensen | A61B 18/1206 375/238 |
| 8,629,520 B2* | 1/2014 | Doogue | B82Y 25/00 257/422 |
| 8,907,437 B2* | 12/2014 | Milano | G01R 15/207 174/536 |
| 8,952,471 B2* | 2/2015 | Doogue | B82Y 25/00 257/422 |
| 9,082,957 B2* | 7/2015 | Doogue | B82Y 25/00 |
| 9,325,553 B2* | 4/2016 | Kaukovuori | H04B 1/0057 |
| 9,344,108 B2* | 5/2016 | Hampel | H03M 3/506 |
| 9,363,004 B2* | 6/2016 | Kis | H04B 7/0811 |
| 9,379,785 B2 | 6/2016 | Shameli et al. | |
| 9,385,790 B1* | 7/2016 | Mukherjee | H04B 5/0087 |
| 9,551,762 B1 | 1/2017 | Cesaretti | |
| 9,559,880 B1* | 1/2017 | Cirit | H04L 25/08 |
| 9,590,706 B1* | 3/2017 | Frank | H04B 7/0417 |
| 9,590,708 B1* | 3/2017 | Frank | H04B 7/0456 |
| 9,614,557 B1* | 4/2017 | Mayer | H04B 17/13 |
| 9,634,736 B2* | 4/2017 | Mukherjee | H04B 5/0087 |
| 9,685,923 B2* | 6/2017 | Candage | H03F 1/26 |
| 9,768,978 B2 | 9/2017 | Coenen et al. | |
| 9,941,999 B1* | 4/2018 | Milesi | H04L 1/0036 |
| 2004/0189271 A1 | 9/2004 | Hansson et al. | |
| 2008/0136442 A1 | 6/2008 | Chen | |
| 2008/0267301 A1* | 10/2008 | Alfano | H01L 23/48 375/258 |
| 2009/0069801 A1* | 3/2009 | Jensen | A61B 18/1206 606/34 |
| 2010/0245052 A1 | 9/2010 | Kitayoshi | |
| 2011/0204460 A1* | 8/2011 | Wong | H01L 43/065 257/427 |
| 2013/0020660 A1* | 1/2013 | Milano | G01R 15/207 257/427 |
| 2013/0179818 A1 | 7/2013 | Wang et al. | |
| 2013/0242616 A1 | 9/2013 | Oldenkamp | |
| 2013/0278438 A1* | 10/2013 | Mueck | G08C 15/00 340/870.16 |
| 2014/0312923 A1 | 10/2014 | Alley | |
| 2015/0103986 A1 | 4/2015 | Chen et al. | |
| 2016/0197560 A1 | 7/2016 | Leedham et al. | |
| 2016/0282388 A1* | 9/2016 | Milano | H01L 43/02 |
| 2017/0012622 A1 | 1/2017 | Peter et al. | |
| 2017/0030980 A1* | 2/2017 | Kosier | G01R 33/07 |
| 2017/0187200 A1 | 6/2017 | Somerville et al. | |
| 2017/0285117 A1 | 10/2017 | Drouin et al. | |

OTHER PUBLICATIONS

Jim Daughton: "Spin-Dependent Sensors", Proceedings of the IEEE, vol. 91, No. 5; May 2003; pp. 681-686; 6 Pages.
Cantrell et al., "Maximizing Performance and Integration in Application Requiring Isolated SPI", Analog Devices, downloaded on Jul. 21, 2017 from www.analog.com; 4 Pages.
Texas Instruments, "ISO7842x High-Performance, 8000-$V_{PK}$ Reinforced Quad-Channel Digital Isolator"; Revised Mar. 2017, downloaded on Jul. 21, 2017 from www.ti.com; 38 Pages.
U.S. Non-Final Office Action dated Jul. 17, 2017 for U.S. Appl. No. 15/453,034; 7 Pages.
Response to U.S. Non-Final Office Action dated Jul. 17, 2017 for U.S. Appl. No. 15/453,034; Response Filed Sep. 22, 2017; 8 Pages.
U.S. Non-Final Office Action dated Jan. 11, 2018 for U.S. Appl. No. 15/453,034; 14 Pages.
Response to U.S. Non-Final Office Action dated Jan. 11, 2018 for U.S. Appl. No. 15/453,034; Response Filed Jan. 22, 2018; 8 Pages.
U.S. Notice of Allowance dated Feb. 14, 2018 for U.S. Appl. No. 15/453,034; 12 Pages.
PCT International Search Report and Written Opinion dated Apr. 6, 2018 for International Application No. PCT/US2018/015133; 15 Pages.

* cited by examiner

US 10,142,052 B2

METHODS AND APPARATUS FOR COMMUNICATION OVER AN ISOLATION BARRIER WITH MONITORING

CROSS REFERENCE TO RELATED APPLICATIONS

This application is a continuation application of U.S. patent application Ser. No. 15/453,034 filed Mar. 8, 2017, and entitled "METHODS AND APPARATUS FOR COMMUNICATION OVER AN ISOLATION BARRIER WITH MONITORING", which application is hereby incorporated herein by reference in its entirety.

BACKGROUND

There are a variety of ways to communicate over a channel. Each type of communication channel has advantages and disadvantages and various design tradeoffs. Some systems are more susceptible to dynamic signal distortion than others and some systems have better error detection and/or recovery than others.

Signal isolators can be used to transfer information without a physical connection. For example, optocouplers can include a LED that emits light through an optically transparent insulating film (or dielectric) and strikes a photo detector that generates a current flow that corresponds to the emitted light. RF carriers can also be used to transmit information through a barrier. Data can be transferred from input to output using on/off keying (OOK) or other techniques. Conventional communication channels may have limited channel integrity in signal isolator implementations that restricts their use in certain applications.

SUMMARY

Embodiments of the invention provide method and apparatus for transmission of digital data across an isolation barrier that may reduce dynamic distortions of the signals (e.g., pulse width distortion, propagation delay), improve error recovery from glitches or coupled noise during the transmission, fault detection, and enhance channel integrity, such as for safety-critical systems, e.g, ASIL.

In one aspect of the invention, a method comprises: receiving an input data stream having first and second states; generating a first pulse train type for the first state; generating a second pulse train type for second state, wherein the first and second pulse train types comprise different characteristics; transmitting the first and second pulse train types across a voltage barrier of a digital signal isolator; receiving pulses for the transmitted first and second pulse train types from the voltage barrier; demodulating the first and second pulse trains types to recover the input data stream in an output data stream; and setting a signal integrity timeout to detect a lack of pulses received or transmitted for the first and second pulse train types corresponding to a fault condition.

An example method can further include one or more of the following features: the first pulse train type includes pulses corresponding to rising and falling edges of the first and second states and refresh pulses, refresh pulses for the first state comprise a first repetition rate and refresh pulses for the second state comprise a second repletion rate which is different than the first repetition rate, recovering from a glitch on the received pulses using one of the received refresh pulses, a time to recover from the glitch is different depending upon whether the glitch occurs during the first state or the second state, setting a glitch timeout to detect a transmission error condition, setting a signal integrity timeout to detect a lack of received pulses correspond to a system fault condition, the signal isolator includes a magnetic field sensing element, the magnetic field sensing element comprises a magnetoresistive element, the first and second pulse types are transmitted using differential signals, the input data stream is provided by a first system and the output data stream is sent to a second system, sending data from the second system across the voltage barrier to the first system in response to the received pulses, and/or using a feedback channel to send data and safety status information from the second system to the first system using a same I/O pin of the digital isolator.

In another aspect of the invention, a digital isolator integrated circuit package comprises: a first input to receive an input data stream having first and second states; a pulse modulation module to generate a first pulse train for the first state and a second pulse train for second state, wherein the first and second pulse trains comprise different characteristics; a driver coupled to the pulse modulation module to transmit the first and second pulse types across a voltage barrier; a receiver coupled to the voltage barrier; a pulse detector coupled to the receiver to demodulate the first and second pulse trains to recover the input data stream in an output data stream; and a signal integrity module having a signal integrity timeout to detect a lack of pulses received or transmitted for the first and second pulse train types corresponding to a fault condition.

An example digital isolator integrated circuit package can further include one or more of the following features: a system integrity module to detect a lack of pulses for the first and second pulse trains or other system safety-critical parameters and generate a status signal, first pulse train type includes pulses corresponding to rising and falling edges of the first and second states and refresh pulses, refresh pulses for the first state comprise a first repetition rate and refresh pulses for the second state comprise a second repletion rate which is different than the first repetition rate, the integrated circuit is configured to recover from a glitch on the received pulses using one of the received refresh pulses, a time to recover from the glitch is different depending upon whether the glitch occurs during the first state or the second state, the integrated circuit is further configured to set a glitch timeout to detect a fault condition, the integrated circuit is further configured to set a signal integrity timeout to detect a lack of received pulses correspond to a fault condition, the signal isolator includes a magnetic field sensing element, and/or the magnetic field sensing element comprises a magnetoresistive element.

In a further aspect of the invention, a signal isolator comprises: a first input to receive an input data stream having first and second states; a means for pulse modulation to generate a first pulse train for the first state and a second pulse train for second state, wherein the first and second pulse trains comprise different characteristics; a driver means coupled to the means for pulse modulation to transmit the first and second pulse types across a voltage barrier; a receiver means coupled to the voltage barrier; a pulse detector means coupled to the receiver for demodulating the first and second pulse trains to recover the input data stream in an output data stream; and a signal integrity means for detecting to detect a lack of pulses received or transmitted for the first and second pulse train types corresponding to a fault condition.

An example signal isolator can further include one or more of the following features: a system integrity means for detecting a lack of pulses for the first and second pulse trains or other system safety-critical parameters and generating a status signal, first pulse train type includes pulses corresponding to rising and falling edges of the first and second states and refresh pulses, refresh pulses for the first state comprise a first repetition rate and refresh pulses for the second state comprise a second repletion rate which is different than the first repetition rate, the signal isolator is configured to recover from a glitch on the received pulses using one of the received refresh pulses, a time to recover from the glitch is different depending upon whether the glitch occurs during the first state or the second state, the signal isolator is further configured to set a glitch timeout to detect a fault condition, the signal isolator is further configured to set a signal integrity timeout to detect a lack of received pulses correspond to a fault condition, the signal isolator includes a magnetic field sensing element, and/or the magnetic field sensing element comprises a magnetoresistive element.

BRIEF DESCRIPTION OF THE DRAWINGS

The foregoing features of this invention, as well as the invention itself, may be more fully understood from the following description of the drawings in which.

DETAILED DESCRIPTION

Figure 1:
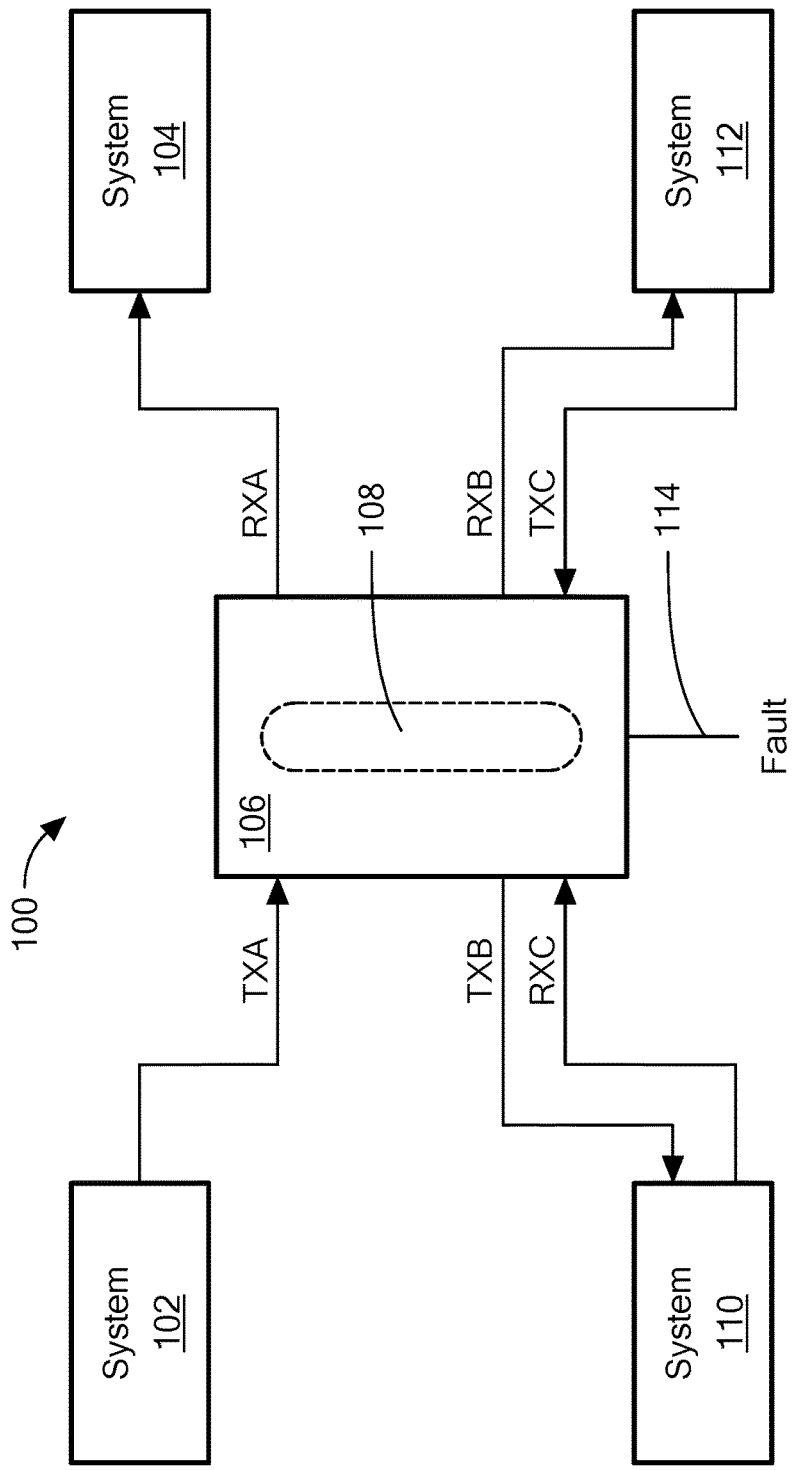
FIG. 1 is a schematic representation of a system having a signal isolator to enable communication between different systems.

FIG. 1 shows an example system 100 including a first system 102 coupled to a second system 104 via a digital signal isolator 106 with communication having enhanced data and system integrity in accordance with illustrative embodiments. In embodiments, the signal isolator 106 is provided as an integrated circuit with an isolation barrier 108 across which signals transmitted by the first system 102 are sent to the second system 104 without a physical connection. In embodiments, the first and second systems 102, 104 may operate at different voltage levels.

In embodiments, a third system 110 and a fourth system 112 communicate via the signal isolator 106 through a first channel over which the third system 110 transmits data to the fourth system 112 and a second channel over which the fourth system transmit data to the third system. The first channel includes a TXB input to the isolator 106 and a RXB output to the fourth system 104. The second channel includes a TXC input to the isolator 106 and a RXC output to the third system 110.

In embodiments, the isolator 106 can have a fault pin 114. In embodiments, the isolator 106 can include a variety of error, status, fault, and other I/O signals to meet the needs of a particular application.

Suitable types of isolators may include capacitive, transformer, and magnetic field/sensor based technologies. It is understood that the first and second systems 102, 104 may be provided as a wide range of systems, devices, ICs, circuits, and the like.

Figure 2:
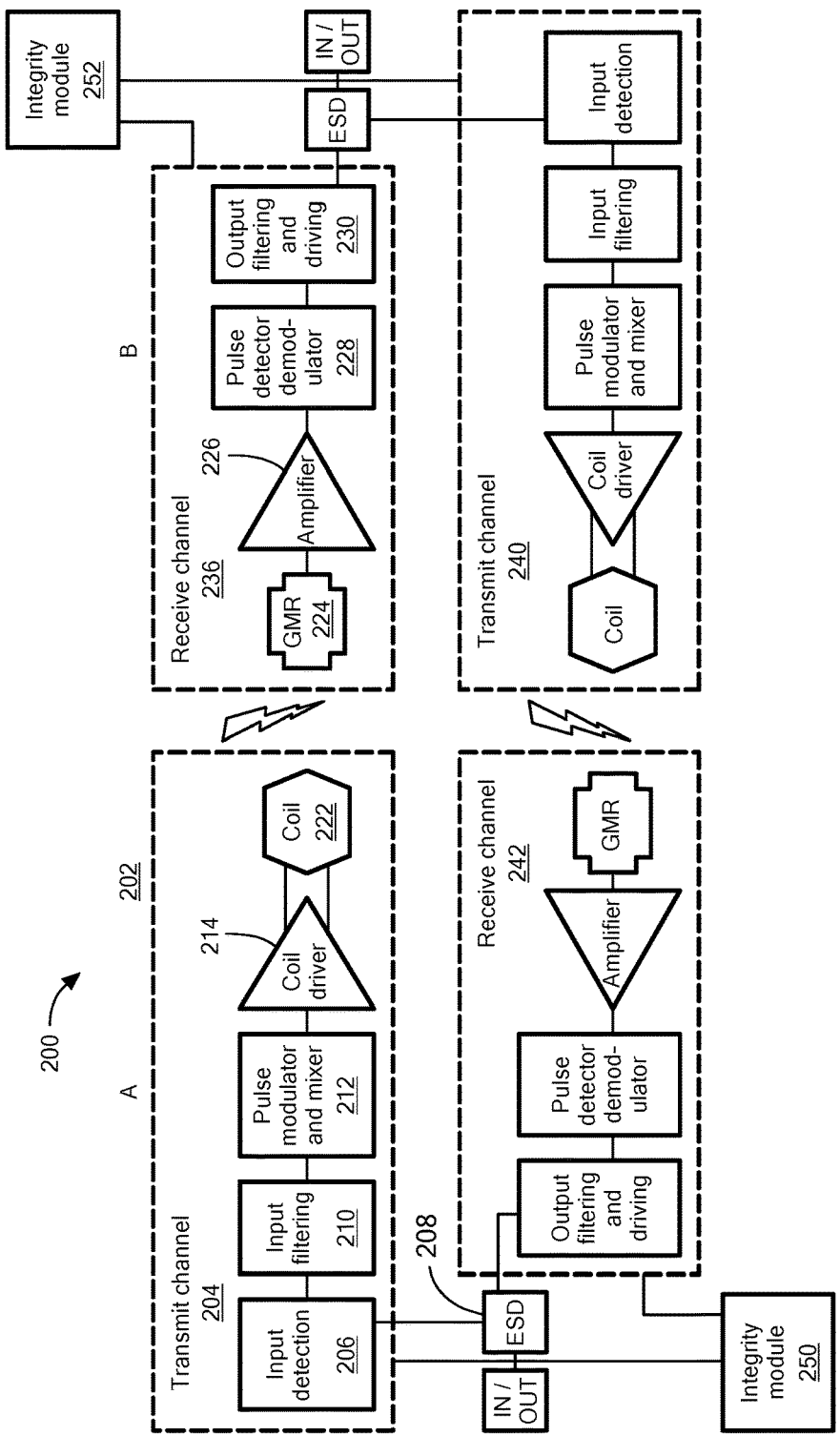
FIG. 2 is a schematic representation of a system having a coil-based signal isolator to enable communication between different systems.

FIG. 2 shows an example system 200 with an isolator 202 having a first transmit channel 204 and a first receive channel 236. The first transmit channel 204 includes an input detection module 206 coupled to an optional electrostatic discharge (ESD) protection module 208, which is coupled to a I/O pin of the isolator integrated circuit (IC) package. The input detection module 206 provides an output to an input filter module 210, which is coupled to a pulse modulator and mixer module 212. In embodiments, a digital one or zero on the I/O pin is modulated by the pulse modulator and mixer module 212 to energize the coil driver 214, which can drive a transmit coil 222 near which a magnetic field sensing element 224 is located. In embodiments, the magnetic field sensing element 224 is provided as a GMR element. The magnetic field sensing element output is amplified 226 and provided to a pulse detection and demodulation module 228 the output of which is coupled to an output filter/driver module 230 that drives the signal to an output I/O of the isolator IC.

In the illustrated embodiment, an I/O pin is shared to provide a channel though the first transmit channel 204 and receive channel 236 and a feedback channel though a second transmit channel 240 and a second receive channel 242 to provide bi-directional communication between a first device coupled to the first I/O and a second device coupled to the second I/O via the isolator. It is understood that the second transmit and receive channels 240, 242 can be substantially similar to the first transmit and receive channels 204, 236.

In embodiments, the isolator 200 can include an integrity module 250 that can monitor pulse generation, transmission, reception and overall system integrity, as described more fully below. For example, glitch, ASIL, and other timeout functionality can be used to detect fault conditions and other status information.

While an illustrative signal isolator embodiment is shown having a magnetic field sensing element, it is understood that any suitable type of signal isolator can be used for the communication signaling described below. Example types of signal isolators include optical, capacitive, inductive, magnetic, and mechanical devices. It is further understood that any suitable type magnetic field sensing element can be used to meet the needs of a particular application.

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In embodiments of the invention, communication signaling is provided for a digital isolator, for example, to minimize signal distortions, increase error recovery from glitches, noise, and the like, and/or increase channel integrity for safety enhanced systems, such as Automotive Safety Integrity Level (ASIL) systems.

In embodiments, different transmission symbols for each logic state (e.g. a pulse of different polarity, amplitude, frequency content, and/or phase) are sent across the isolation barrier so that both logic states require the presence of a certain transmission symbol. The absence or alteration of some characteristic of the transmission symbols, for example, may indicate a failure of the transmission channel. In one embodiment the transmission is initiated by the asynchronous detection of input state transitions. In embodiments, this triggers a (single) transmission symbol pulse. This single pulse is detected at the receiver on the other side of the isolation barrier. Once this pulse is detected, the state of the output can be latched accordingly and reflects—after a certain propagation delay—the corresponding logic state from the input. The asynchronous nature of the detection of input state change and generation of the pulse minimizes propagation delay and pulse width distortion.

In embodiment, absence of pulses, e.g., a fault, can be indicated by a variety of techniques including, for example, pulse amplitude differing over a certain tolerance range, which can be due to an excessive gain on the signal path indicating an out of spec condition. In general, in embodiments, safety information can be encoded in the repetition rate of the symbols, for example. It other embodiments, safety information can be encoded in any suitable symbol characteristic, such as amplitude, frequency, phase, etc., and the like.

In another embodiment, the input transitions and pulse generation can be synchronous to a system clock. In order to provide robustness on the communication against internally or externally induced disturbances from multiple sources (coupled noise from power supplies, electromagnetic interference, etc.) short bursts of energy can be transmitted with the same polarity/frequency/phase to periodically repeat the symbols of the logic state. This repeated symbol transmission can be utilized until the input state changes and the corresponding (opposite) symbol must be transmitted.

Figure 3:
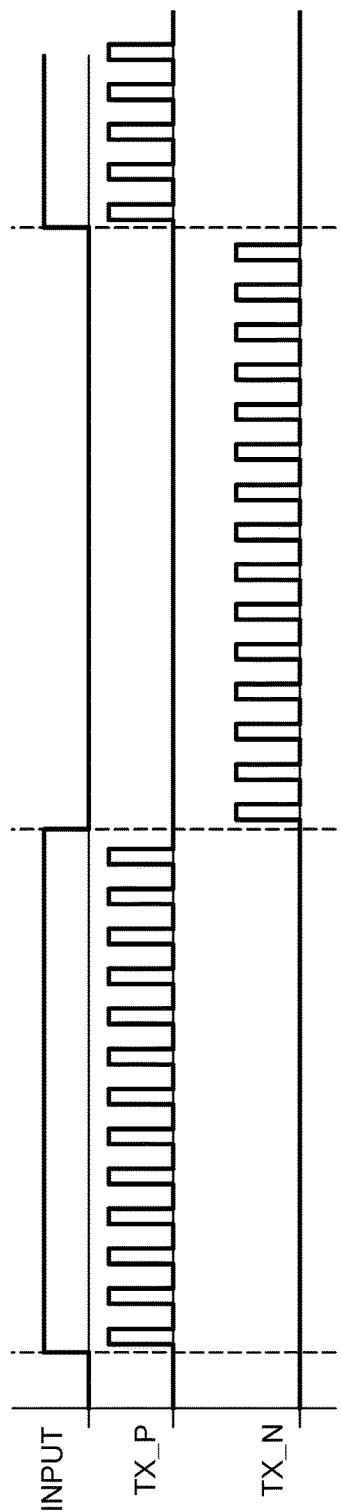
FIG. 3 is a waveform diagram showing transmission symbols for a logical ONE and a ZERO.

FIG. 3 shows an illustrative transmission scheme with different symbols for '0' (ZERO) and '1' (ONE) shown in the input signal. In embodiments, the TX_P and TX_N signals can correspond to the signals driving each terminal of coil 222 of the transmit channel of FIG. 2. The rate of the periodic repetitive symbols can either be generated by an internal or external timing device, which can be included in portions of the transmission hardware (e.g. a self-resonating oscillator making use of the transmission coil/capacitor). Both the nature of the symbols (e.g., amplitude, frequency content, and/or phase) and the rate of repetition can be different and independent for the different logic states. This allows the optimization of the power consumption (the faster the rate the more power needed to inject the symbol pulses), recovery time from disturbance induced errors (the faster the rate, the sooner the proper state is recovered after data corruption), ease of detection (wider, more energetic pulses are easier to detect at the receiver), propagation delay, and pulse width distortion, as described more fully below.

In aspects of the invention, data recovery can be enhanced compared with conventional communication signaling. Input and output state accuracy can recover if the output state incorrectly changes due to an externally or internally induced disturbance, e.g., a glitch. A correction can be achieved by the next transition symbol pulse or repetitive/refresh pulse, thereby limiting the recovery time to the repetition interval of the pulses.

In embodiments, one of the logic states may be considered the output "default" state (for example, logic '0'). In this case if a transmission pulse is not received within a timeout window, the output will go to the default state. This allows the repetition rate of the default state symbols (TR0) (see FIG. 4) to be slower than the non-default state (TR1) while maintaining relatively fast error recovery times (given by the timeout time, slightly longer than TR1). In this case, the output default state timeout can be set according to the known TR1, as a falsely detected '1' will return to '0' after this timeout, providing a fast recovery time. TR0, in this example, will only provide system integrity/safety detection and can be independently set (usually a longer, less critical time).

Figure 4:
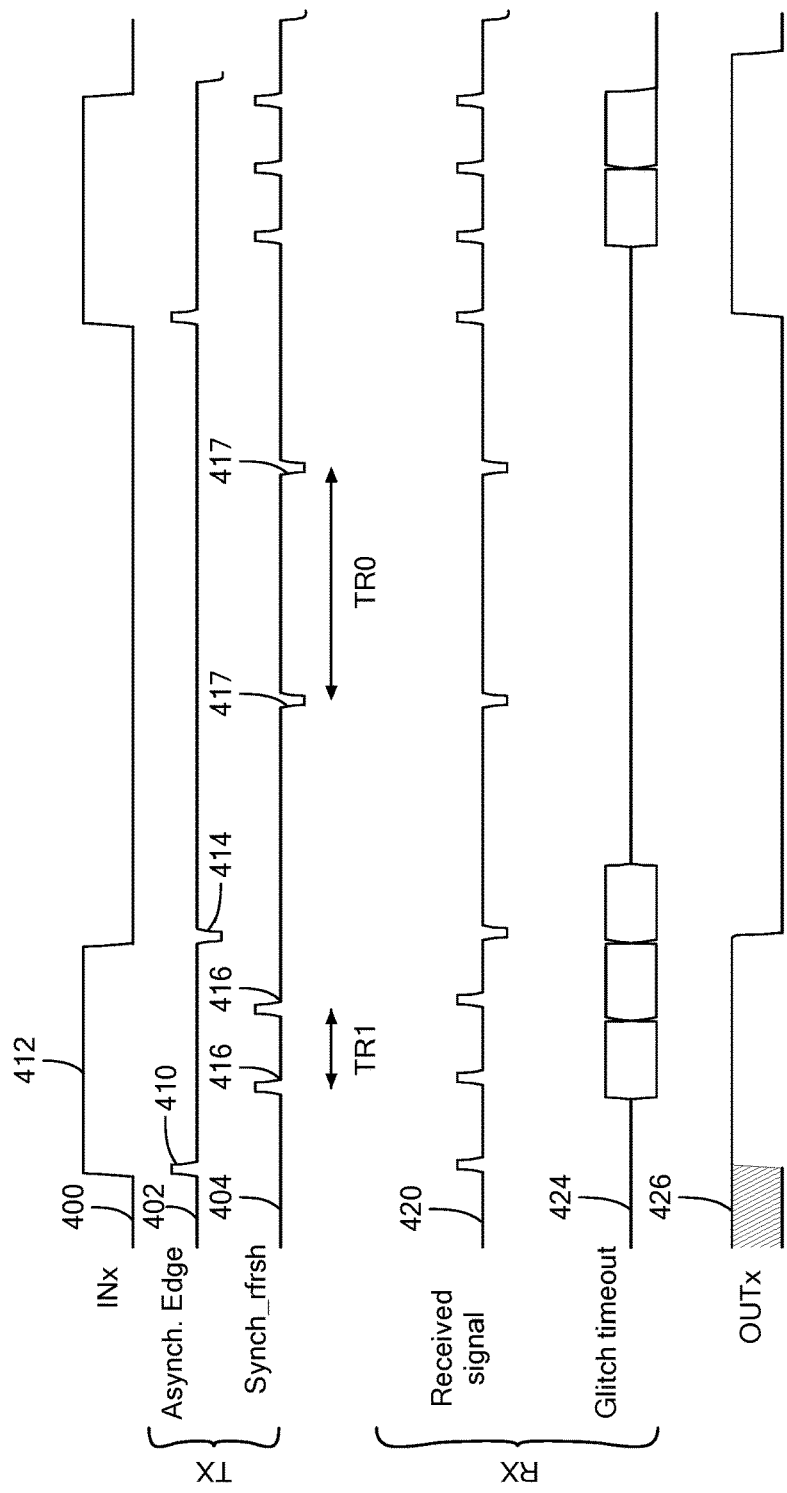
FIG. 4 is a waveform diagram showing refresh rates for a logical ONE and a ZERO.

FIG. 4 shows an example refresh rate for a ONE and a ZERO. An input data stream INx 400 into the isolator has ONEs and ZEROs for transmission. An asynchronous edge signal 402 has positive and negative pulses that correspond to rising and falling edges of the input data stream INx. A synchronous refresh signal 404 has refresh pulses at a given repetition rate. In the illustrated input data stream INx 400, a first positive pulse 410 in the asynchronous edge signal 402 is generated at the rising edge of the first ONE 412 and a first negative pulse 414 is generated at the falling edge of the ONE. Refresh pulses 416 are generated at given intervals from the rising edge of the first ONE 412 until the first negative pulse 414 occurs at the transition from ONE to ZERO. Negative refresh pulses 417 are generated during a ZERO. It is understood that the transmitted signal includes the asynchronous edge signal 402 pulses and the synchronous edge signal 404 pulses (see received signal 420).

Figure 5:
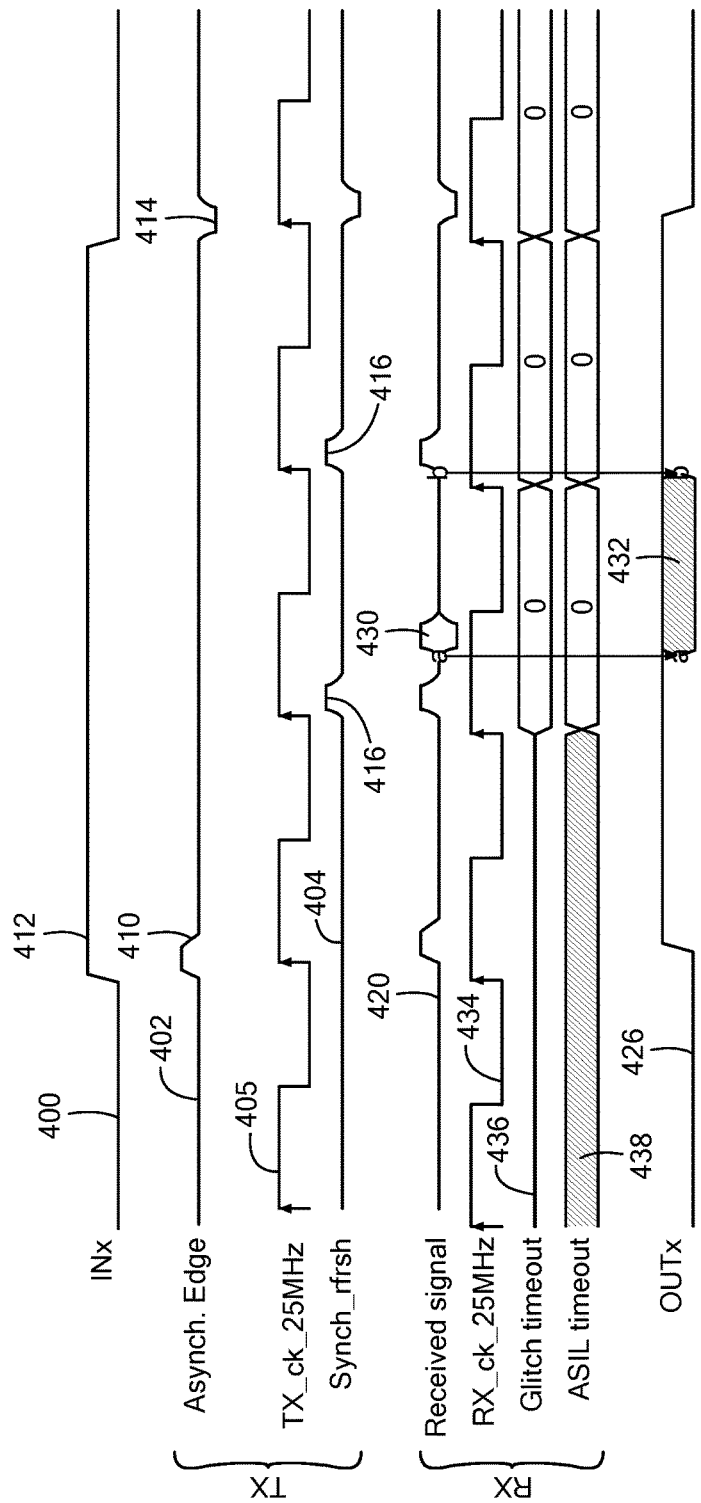
FIG. 5 is a waveform diagram showing glitch response for a logical ONE.

In embodiments, the pulse modulation and mixer 212 of FIG. 2, for example, can generate the asynchronous edge signal 402 and synchronous refresh signal 404. As shown in FIG. 5, a transmit clock 405 can be used by the pulse modulation and mixer 212.

As can be seen, pulses are transmitted during both ONEs and ZEROs of the input signal INx 400. It will be appreciated that the lack of pulses may indicate an error condition of some kind. It is understood that the periodic repetition of symbols—regardless of the input activity—allows for monitoring of channel integrity since most failures in the system circuitry yield an inactive or "stuck" state on the channel. Proper timeout (TSF) for the detection of symbols provide a means of detecting a faulty channel.

The received signal 420 receives the transmitted pulses. The output signal OUTx 426 corresponds to the input signal INx 400 that was transmitted.

FIG. 5 shows glitch handling during a ONE on the input signal for a portion of the signals shows in FIG. 4. The transmitter can utilize a transmit clock 405 at a given frequency shown as 25 MHz in the illustrated embodiment. In embodiments, the rising edges of the transmit clock 405 generate the synchronous refresh signal 404.

In the illustrated embodiment, the received signal 420 includes a glitch 430 that creates a period of uncertainty 432 in the output signal OUT 426. The receive side can include a receive clock 434 that may be synched to the transmit clock 405. In the illustrated embodiment, the glitch 430 occurs slightly after a refresh pulse 416 is received while the output OUTx 426 is ONE. The glitch 430 results in an uncertain state 432 in the output signal OUTx 426 until the next pulse is received, which is a second refresh pulse 416 in the illustrated embodiment. The rate of refresh pulses hence determine the duration of the uncertain state 432.

In example embodiments, the receive clock 434 defines intervals in a glitch timeout signal 436 and an ASIL timeout signal 438, which may have the same or different values. For example, if a glitch timeout value is exceeded due to an extended duration of output OUTx uncertainty 432, a glitch error can be detected. Similarly, an extended glitch can trigger an ASIL error.

Figure 6:
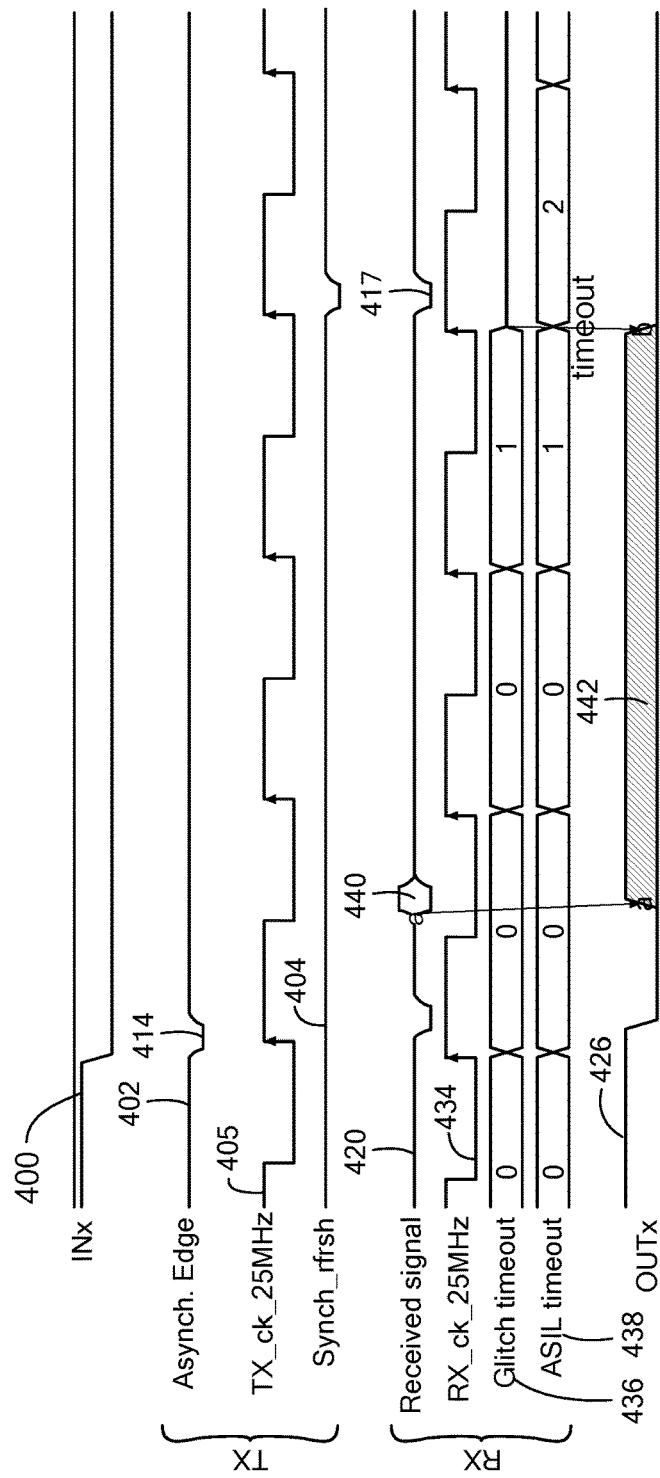
FIG. 6 is a waveform diagram showing glitch response for a logical ZERO.

FIG. 6 shows glitch processing during a ZERO generating the negative pulse 414 at the falling edge of the transition from a ONE to a ZERO. The received signal 420 includes a glitch 440 after the negative pulse resulting in a period of uncertainty 442 in the output signal OUTx 426. The uncertainty 442 in the output state remains until the first negative refresh pulse 417 is received. Values in the glitch timeout 436 and/or ASIL timeout 438 may be exceeded to generate respective errors.

Figure 7:
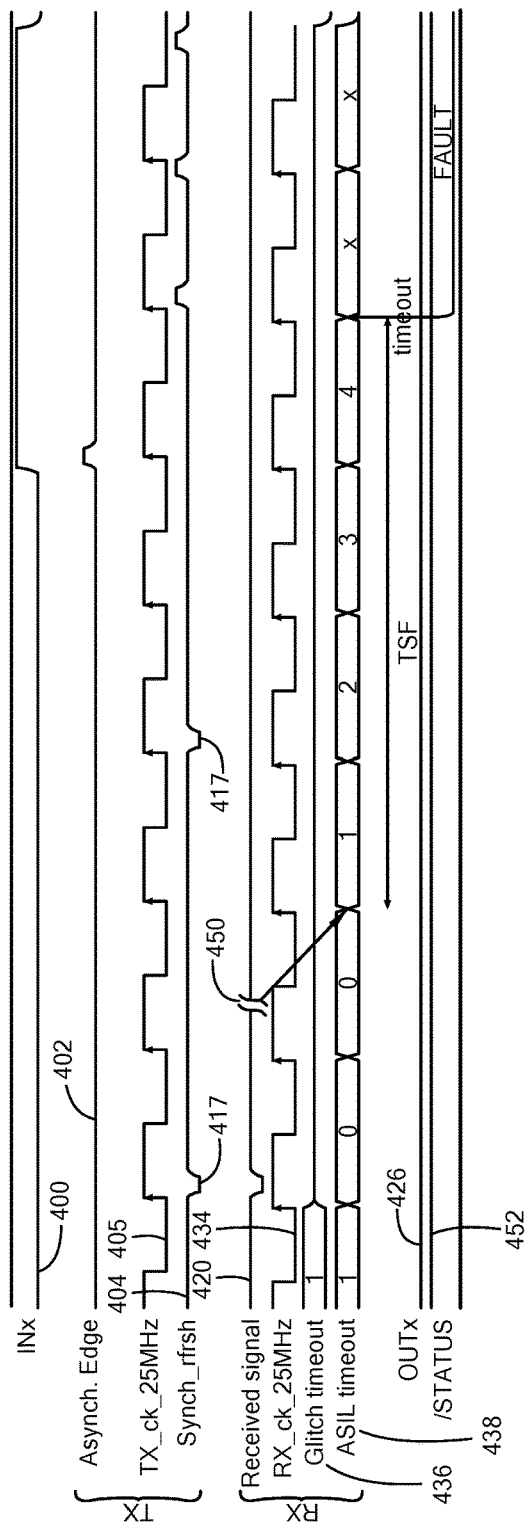
FIG. 7 is a waveform diagram showing example fault detection.

FIG. 7 shows an example in which transmit pulses 402, 404 are not received on the receive side 420. In the illustrated example, there is a break 450 due to which a second negative refresh pulse 417 that was transmitted is not received. Since no pulses are received after the break, the values in the ASIL timeout 438 continue to increase. When some threshold value is exceeded, a fault is indicated in a transition of a status signal 452.

In embodiments, the status signal 452 can be generated by a monitoring module, such as the integrity module 250 of FIG. 2. It is understood that any variety of signals, such as status, fault, timeout, and the like, can be generated to meet the needs of a particular application.

In example isolators, there may be two different sides of the isolation barrier with different power domains and different dynamics. The nature of the applications nominally makes the two sides unaware of the integrity of the other side. In order to provide enhanced safety features and system integrity awareness across the barrier, side integrity information may be communicated across the isolation barrier in a feedback channel. This can be achieved by using a reverse channel communication path. In embodiments, a feedback channel may eventually be the same physical channel using a multiplexing technique to share the physical channel between the forward and reverse paths: e.g. frequency/time/code multiplexing), to send repetitive pulses back to the main transmitter to indicate side integrity status. Side integrity information could also be embedded in the information sent across one of the data channels without needing a completely separate channel.

In embodiments, for full-duplex channels, the reverse (feedback) communication can occur in the same physical channel. For example, in capacitive-coupled isolators, the channel may be bi-directional so that reverse communication can occur during time intervals where the forward path is inactive (time multiplexing between "transmission" and "reception").

Referring again to FIG. 2, a first transmit channel 204, which can be referred to a side A, is a main data transmitter to a first receive channel 236 on side B. A secondary feedback channel can be provided by the second transmit channel 240 on side B and a second receive channel 242 on side A. In the illustrated embodiment, the A side transmit and receive channels 204, 242 share an I/O pin of the isolator. In other embodiments, separate I/O pins can be used. In some embodiments, I/Os can be shared. For example, a feedback channel can provide feedback for multiple A to B channels.

In one embodiment, a feedback channel commanded by B side sends pulses back to A side for as long as the B side considers the system integrity intact. Once a fault is detected (e.g., a timeout on the receiver, an under-voltage condition, a floating pin detected, a thermal protection engaged), the B side stops sending integrity pulses. After a time, the A side detects the absence of pulses, such as with timeouts shown in FIGS. 5-7, and activates a FAULT signal.

In other embodiments, a feedback channel alters the rate of transmission of the integrity pulses instead of stopping pulse transmission. This may allow more for flexibility in the selection of a FAULT detection response time.

In some embodiments, if an initial FAULT state is triggered by A side, the main communication channel can stop data and repetitive pulses to side B, such as until the receiver on B side times out and activates a FAULT mode.

In other embodiments, the feedback channel can transmit the same data back to A side which can be encoded with different symbols, so that data integrity/error detection is possible, and not only physical channel failure.

In multiple channel embodiments, a system status feedback and/or data feedback can be transmitted using a single shared feedback channel with the multiplexed/encoded status of all the data channels.

During power-up, a channel synchronization routine can establish an active link between the A and B sides through the use of the main and feedback channels. In embodiments, a predetermined sequence of symbols may be sent through the main/feedback channels. The system status is declared "INACTIVE" or at "FAULT" until each side has detected the predefined sequence. This should ensure that the system is fully active even when, for example, both sides have different power-up dynamics and the higher level system can avoid loss of data. This synchronization stage can also allow both sides to adjust internal parameters that may be required for proper operation (e.g. synchronization of clock frequencies, determination of repetition rates, signal amplitudes and phases, etc.)

Figure 8:
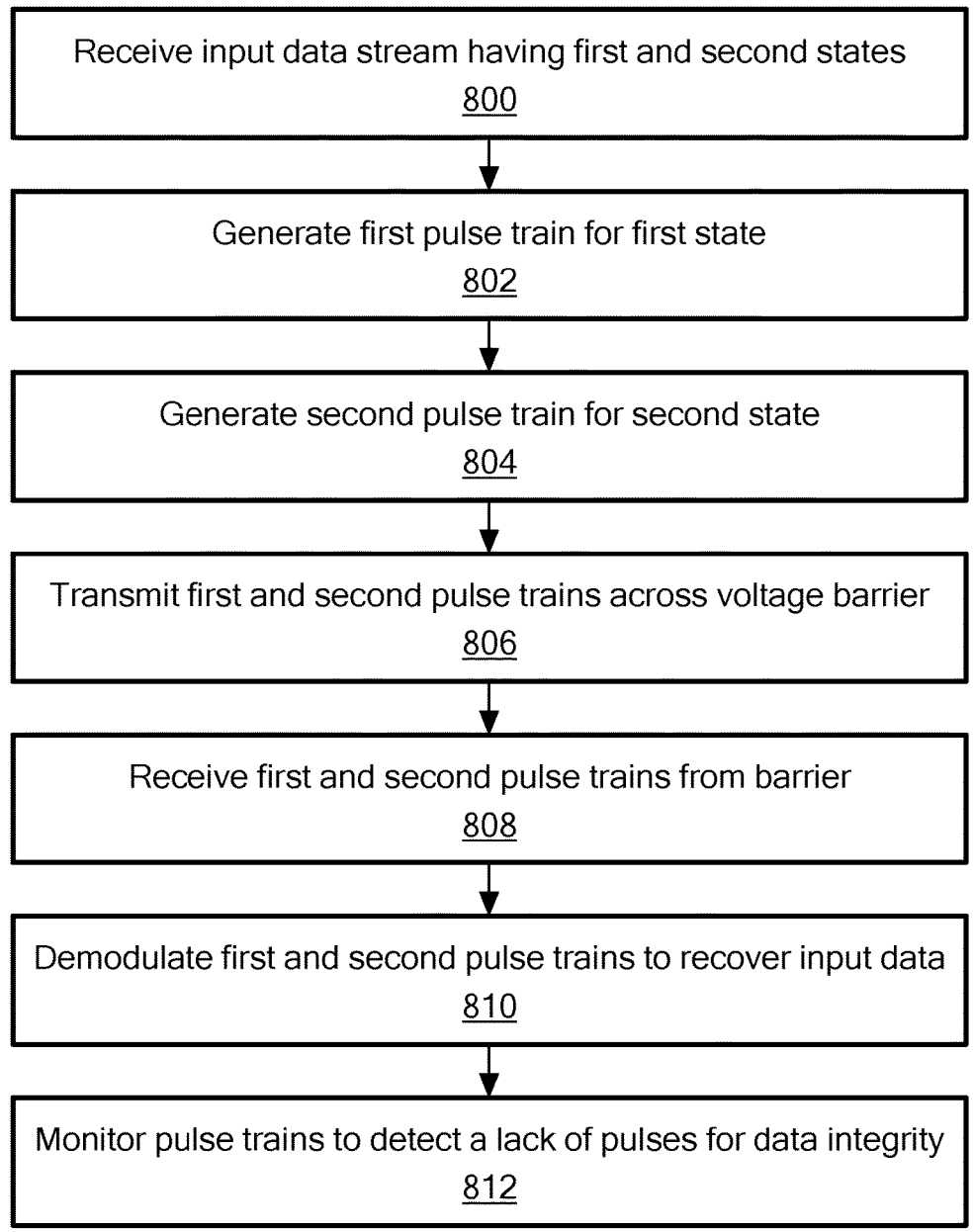
FIG. 8 is a flow diagram showing illustrative steps for communication between systems via a signal isolator.

FIG. 8 shows illustrative steps for providing communication signaling with enhanced data integrity in accordance with example embodiments of the invention. In step 800, an input data stream is received, such as by a digital isolator IC coupled to a first system. In embodiments, the input data stream has first and second states, such as digital ONEs and ZEROS. In step 802, a first symbol type is generated for the first state and in step 804 a second symbol type is generated for the second state. In embodiments, the first and second symbol types are different. In step 806, the first and second symbol types are transmitted across a barrier, such as a voltage barrier of a digital isolator.

In step 808, a receiver receives the symbol types from the barrier and in step 810, the first and second symbol types are demodulated to recover the input data stream provided to the digital isolator. In optional step 812, symbols in the first and second symbol types are monitored to detect fault conditions. Since symbols are generated for both first and second states, symbols should be present so the lack of symbols can indicate a fault condition.

It is understood that the first and second symbol types can be different in one or more of various parameters, such as amplitude, frequency, phase, polarity, and the like. In embodiments, one or more of these parameters can be modified to convey additional information, status, errors, etc. In embodiments, pulse can be transmitted and/or received using single and/or differential signals.

Figure 9A:
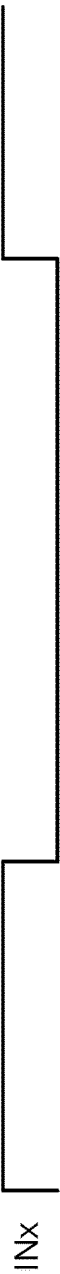
FIG. 9A is an example input data stream.
Figure 9B:
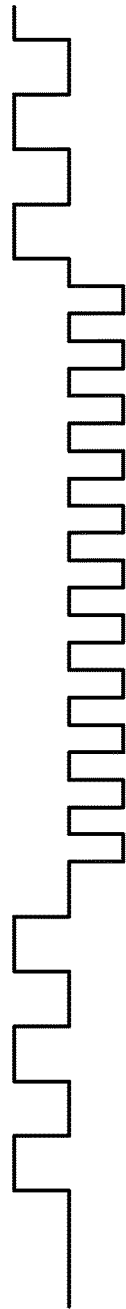
FIG. 9B shows a first example pulse stream types for states of the input data stream.
Figure 9C:
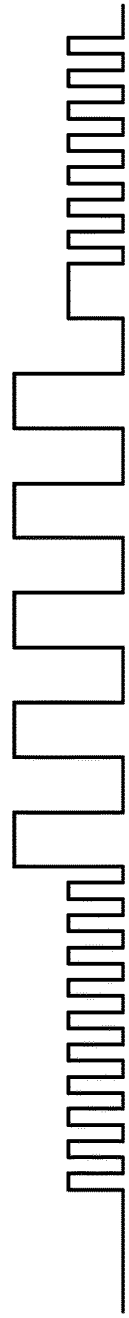
FIG. 9C shows second example pulse stream types for states of the input data stream.
Figure 10:
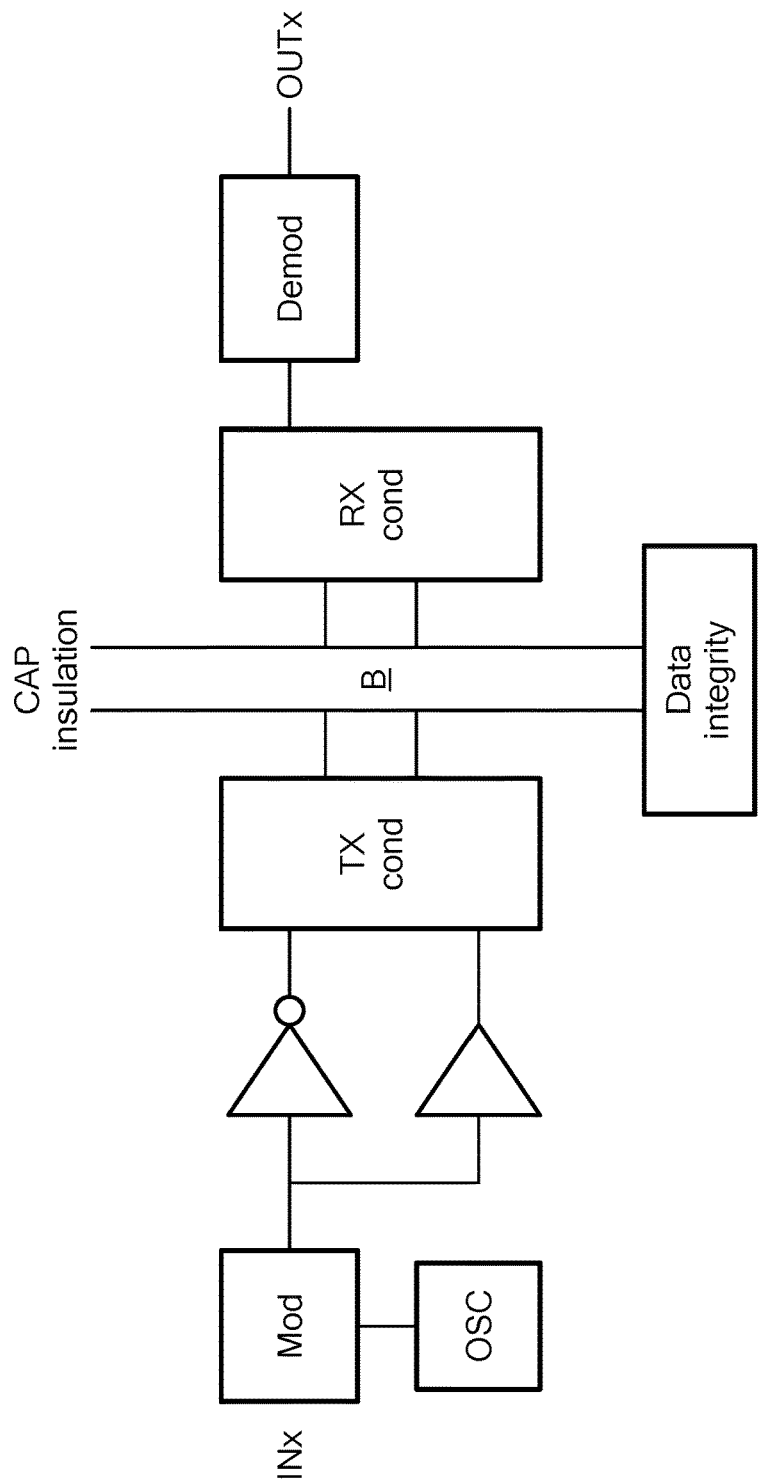
FIG. 10 is a schematic representation of a signal isolator having a capacitive isolation barrier.

FIG. 9A shows an example input data stream INx, FIG. 9B shows example first and second pulse streams PS1, PS2 differing in frequency and polarity for first second states shows as ONE and ZERO. FIG. 9C shows first and second pulse streams differing in frequency and amplitude. Proper selection of the nature and number of unique symbols allows for optimizing various operation parameters such as disturbance rejection, power consumption, data throughput, etc. It is understood that any suitable type of digital signal isolator can be used to meet the needs of a particular application. The illustrative isolator of FIG. 2 shows an isolator having a coil and a magnetic field sensing element to detect a change in field from the pulses on the coil. FIG. 10 shows an example isolator having a barrier B provided by an isolation capacitor. An input data stream from a first system can be processed by a modulator MOD using an oscillator OSC to generate edge pulses and refresh pulses, as described above, for transmission across the barrier B. A receiver RX COND can receive the pulses from the barrier for demodulation DEMOD to recover the input data stream for a second system coupled to the isolator. A data integrity module can monitor transmit and/or receive pulses, as described above, to detect fault conditions, channel status, and the like.

Figure 11:
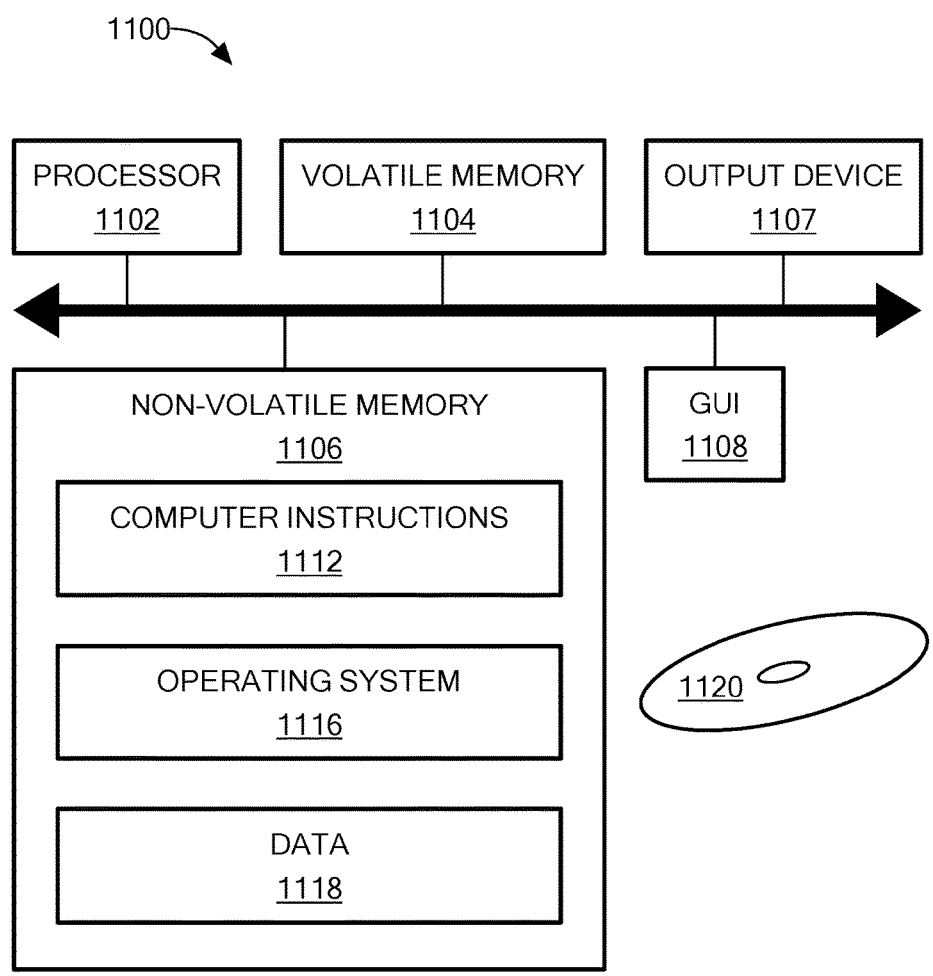
FIG. 11 is a schematic representation of an example computer that can perform at least a portion of the processing described herein.

FIG. 11 shows an exemplary computer 1100 that can perform at least part of the processing described herein. The computer 1100 includes a processor 1102, a volatile memory 1104, a non-volatile memory 1106 (e.g., hard disk), an output device 1107 and a graphical user interface (GUI) 1108 (e.g., a mouse, a keyboard, a display, for example). The non-volatile memory 1106 stores computer instructions 1112, an operating system 1116 and data 1118. In one example, the computer instructions 1112 are executed by the processor 1102 out of volatile memory 1104. In one embodiment, an article 1120 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A method, comprising:
receiving an input data stream having first and second states;
generating a first pulse train type for the first state;

generating a second pulse train type for second state, wherein the first and second pulse train types comprise different characteristics;
transmitting the first and second pulse train types across a voltage barrier of a digital signal isolator;
receiving pulses for the transmitted first and second pulse train types from the voltage barrier;
demodulating the first and second pulse trains types to recover the input data stream in an output data stream;
setting a signal integrity timeout to detect a lack of pulses received or transmitted for the first and second pulse train types corresponding to a fault condition; and
recovering from a glitch on the received pulses using one of the received refresh pulses.

2. The method according to claim 1, wherein the first pulse train type includes pulses corresponding to rising and falling edges of the first and second states and refresh pulses.

3. The method according to claim 1, wherein a time to recover from the glitch is different depending upon whether the glitch occurs during the first state or the second state.

4. The method according to claim 1, further including setting a glitch timeout to detect a fault condition.

5. The method according to claim 1, further including setting the signal integrity timeout to detect a lack of received pulses correspond to a fault condition.

6. The method according to claim 1, wherein the signal isolator includes a magnetic field sensing element.

7. The method according to claim 6, wherein the magnetic field sensing element comprises a magnetoresistive element.

8. The method according to claim 1, wherein the first and second pulse types are transmitted using differential signals.

9. The method according to claim 1, wherein the input data stream is provided by a first system and the output data steam is sent to a second system.

10. The method according to claim 9, further including sending data from the second system across the voltage barrier to the first system in response to the received pulses.

11. The method according to claim 9, further including using a feedback channel to send data from the second system to the first system using a same I/O pin of the digital isolator.

12. A digital isolator integrated circuit package, comprising:
a first input to receive an input data stream having first and second states;
a pulse modulation module to generate a first pulse train for the first state and a second pulse train for second state, wherein the first and second pulse trains comprise different characteristics;
a driver coupled to the pulse modulation module to transmit the first and second pulse types across a voltage barrier;
a receiver coupled to the voltage barrier; and
a pulse detector coupled to the receiver to demodulate the first and second pulse trains to recover the input data stream in an output data stream; and
a signal integrity module to detect a lack of pulses received or transmitted for the first and second pulse train types corresponding to a fault condition,
wherein the signal integrity module is configured to detect a lack of pulses for the first and second pulse trains and generate a status signal.

13. The digital isolator integrated circuit package according to claim 12, wherein first pulse train type includes pulses corresponding to rising and falling edges of the first and second states and refresh pulses.

14. The digital isolator integrated circuit package according to claim 12, wherein the integrated circuit is configured to recover from a glitch on the received pulses using one of the received refresh pulses.

15. The digital isolator integrated circuit package according to claim 14, wherein a time to recover from the glitch is different depending upon whether the glitch occurs during the first state or the second state.

16. The digital isolator integrated circuit package according to claim 12, wherein the integrated circuit is further configured to set a glitch timeout to detect a fault condition.

17. The digital isolator integrated circuit package according to claim 12, wherein the integrated circuit is further configured to set a signal integrity timeout to detect a lack of received pulses correspond to a fault condition.

18. The digital isolator integrated circuit package according to claim 12, wherein the signal isolator includes a magnetic field sensing element.

19. The digital isolator integrated circuit package according to claim 18, wherein the magnetic field sensing element comprises a magnetoresistive element.

20. A signal isolator, comprising:
a first input to receive an input data stream having first and second states;
a means for pulse modulation to generate a first pulse train for the first state and a second pulse train for second state, wherein the first and second pulse trains comprise different characteristics;
a driver means coupled to the means for pulse modulation to transmit the first and second pulse types across a voltage barrier;
a receiver means coupled to the voltage barrier;
a pulse detector means coupled to the receiver for demodulating the first and second pulse trains to recover the input data stream in an output data stream; and
a signal integrity means for detecting a lack of pulses received or transmitted for the first and second pulse train types corresponding to a fault condition,
wherein first pulse train type includes pulses corresponding to rising and falling edges of the first and second states and refresh pulses.

21. The signal isolator according to claim 20, wherein the signal integrity means is configured for detecting a lack of pulses for the first and second pulse trains and generating a status signal.

22. A method, comprising:
receiving an input data stream having first and second states;
generating a first pulse train type for the first state;
generating a second pulse train type for second state, wherein the first and second pulse train types comprise different characteristics;
transmitting the first and second pulse train types across a voltage barrier of a digital signal isolator;
receiving pulses for the transmitted first and second pulse train types from the voltage barrier;
demodulating the first and second pulse trains types to recover the input data stream in an output data stream;
setting a signal integrity timeout to detect a lack of pulses received or transmitted for the first and second pulse train types corresponding to a fault condition; and
setting a glitch timeout to detect a fault condition.

23. The method according to claim 22, wherein the first pulse train type includes pulses corresponding to rising and falling edges of the first and second states and refresh pulses.

24. The method according to claim 22, wherein a time to recover from the glitch is different depending upon whether the glitch occurs during the first state or the second state.

25. The method according to claim 22, further including setting the signal integrity timeout to detect a lack of received pulses correspond to a fault condition.

26. The method according to claim 22, wherein the signal isolator includes a magnetic field sensing element.

27. The method according to claim 26, wherein the magnetic field sensing element comprises a magnetoresistive element.

28. The method according to claim 22, wherein the first and second pulse types are transmitted using differential signals.

29. The method according to claim 22, wherein the input data stream is provided by a first system and the output data steam is sent to a second system.

30. The method according to claim 29, further including sending data from the second system across the voltage barrier to the first system in response to the received pulses.

31. The method according to claim 29, further including using a feedback channel to send data from the second system to the first system using a same I/O pin of the digital isolator.

32. A method, comprising:
receiving an input data stream having first and second states;
generating a first pulse train type for the first state;
generating a second pulse train type for second state, wherein the first and second pulse train types comprise different characteristics;
transmitting the first and second pulse train types across a voltage barrier of a digital signal isolator;
receiving pulses for the transmitted first and second pulse train types from the voltage barrier;
demodulating the first and second pulse trains types to recover the input data stream in an output data stream;
setting a signal integrity timeout to detect a lack of pulses received or transmitted for the first and second pulse train types corresponding to a fault condition; and
setting the signal integrity timeout to detect a lack of received pulses correspond to a fault condition.

33. The method according to claim 32, wherein the first pulse train type includes pulses corresponding to rising and falling edges of the first and second states and refresh pulses.

34. The method according to claim 32, further including recovering from a glitch on the received pulses using one of the received refresh pulses.

35. The method according to claim 34, wherein a time to recover from the glitch is different depending upon whether the glitch occurs during the first state or the second state.

36. The method according to claim 32, wherein the signal isolator includes a magnetic field sensing element.

37. The method according to claim 36, wherein the magnetic field sensing element comprises a magnetoresistive element.

38. The method according to claim 32, wherein the first and second pulse types are transmitted using differential signals.

39. The method according to claim 32, wherein the input data stream is provided by a first system and the output data steam is sent to a second system.

40. The method according to claim 39, further including sending data from the second system across the voltage barrier to the first system in response to the received pulses.

41. The method according to claim 39, further including using a feedback channel to send data from the second system to the first system using a same I/O pin of the digital isolator.

42. A method, comprising:
receiving an input data stream having first and second states;
generating a first pulse train type for the first state;
generating a second pulse train type for second state, wherein the first and second pulse train types comprise different characteristics;
transmitting the first and second pulse train types across a voltage barrier of a digital signal isolator, wherein the signal isolator includes a magnetic field sensing element;
receiving pulses for the transmitted first and second pulse train types from the voltage barrier;
demodulating the first and second pulse trains types to recover the input data stream in an output data stream; and
setting a signal integrity timeout to detect a lack of pulses received or transmitted for the first and second pulse train types corresponding to a fault condition.

43. The method according to claim 42, wherein the first pulse train type includes pulses corresponding to rising and falling edges of the first and second states and refresh pulses.

44. The method according to claim 42, further including recovering from a glitch on the received pulses using one of the received refresh pulses, wherein a time to recover from the glitch is different depending upon whether the glitch occurs during the first state or the second state.

45. The method according to claim 42, wherein the magnetic field sensing element comprises a magnetoresistive element.

46. The method according to claim 42, wherein the first and second pulse types are transmitted using differential signals.

47. The method according to claim 42, wherein the input data stream is provided by a first system and the output data steam is sent to a second system.

48. The method according to claim 47, further including sending data from the second system across the voltage barrier to the first system in response to the received pulses.

49. The method according to claim 47, further including using a feedback channel to send data from the second system to the first system using a same I/O pin of the digital isolator.

50. A method, comprising:
receiving an input data stream having first and second states;
generating a first pulse train type for the first state;
generating a second pulse train type for second state, wherein the first and second pulse train types comprise different characteristics;
transmitting the first and second pulse train types across a voltage barrier of a digital signal isolator;
receiving pulses for the transmitted first and second pulse train types from the voltage barrier;
demodulating the first and second pulse trains types to recover the input data stream in an output data stream; and
setting a signal integrity timeout to detect a lack of pulses received or transmitted for the first and second pulse train types corresponding to a fault condition, wherein the first and second pulse types are transmitted using differential signals.

51. The method according to claim 50, wherein the first pulse train type includes pulses corresponding to rising and falling edges of the first and second states and refresh pulses.

52. The method according to claim 50, further including recovering from a glitch on the received pulses using one of the received refresh pulses, wherein a time to recover from the glitch is different depending upon whether the glitch occurs during the first state or the second state.

53. The method according to claim 50, wherein the signal isolator includes a magnetic field sensing element, wherein the magnetic field sensing element comprises a magnetoresistive element.

54. The method according to claim 50, further including sending data from the second system across the voltage barrier to the first system in response to the received pulses.

55. The method according to claim 54, further including using a feedback channel to send data from the second system to the first system using a same I/O pin of the digital isolator.

56. A method, comprising:
   receiving an input data stream having first and second states;
   generating a first pulse train type for the first state;
   generating a second pulse train type for second state, wherein the first and second pulse train types comprise different characteristics;
   transmitting the first and second pulse train types across a voltage barrier of a digital signal isolator;
   receiving pulses for the transmitted first and second pulse train types from the voltage barrier;
   demodulating the first and second pulse trains types to recover the input data stream in an output data stream; and
   setting a signal integrity timeout to detect a lack of pulses received or transmitted for the first and second pulse train types corresponding to a fault condition,
   wherein the input data stream is provided by a first system and the output data steam is sent to a second system.

57. The method according to claim 56, wherein the first pulse train type includes pulses corresponding to rising and falling edges of the first and second states and refresh pulses.

58. The method according to claim 56, further including recovering from a glitch on the received pulses using one of the received refresh pulses, wherein a time to recover from the glitch is different depending upon whether the glitch occurs during the first state or the second state.

59. The method according to claim 56, wherein the signal isolator includes a magnetic field sensing element, wherein the magnetic field sensing element comprises a magnetoresistive element.

60. A digital isolator integrated circuit package, comprising:
   a first input to receive an input data stream having first and second states;
   a pulse modulation module to generate a first pulse train for the first state and a second pulse train for second state, wherein the first and second pulse trains comprise different characteristics;
   a driver coupled to the pulse modulation module to transmit the first and second pulse types across a voltage barrier;
   a receiver coupled to the voltage barrier; and
   a pulse detector coupled to the receiver to demodulate the first and second pulse trains to recover the input data stream in an output data stream; and
   a signal integrity module to detect a lack of pulses received or transmitted for the first and second pulse train types corresponding to a fault condition,
   wherein first pulse train type includes pulses corresponding to rising and falling edges of the first and second states and refresh pulses.

61. The digital isolator integrated circuit package according to claim 60, wherein the integrated circuit is configured to recover from a glitch on the received pulses using one of the received refresh pulses.

62. The digital isolator integrated circuit package according to claim 61, wherein a time to recover from the glitch is different depending upon whether the glitch occurs during the first state or the second state.

63. The digital isolator integrated circuit package according to claim 60, wherein the integrated circuit is further configured to set a glitch timeout to detect a fault condition.

64. The digital isolator integrated circuit package according to claim 60, wherein the integrated circuit is further configured to set a signal integrity timeout to detect a lack of received pulses correspond to a fault condition.

65. The digital isolator integrated circuit package according to claim 60, wherein the signal isolator includes a magnetic field sensing element.

66. The digital isolator integrated circuit package according to claim 65, wherein the magnetic field sensing element comprises a magnetoresistive element.

67. A digital isolator integrated circuit package, comprising:
   a first input to receive an input data stream having first and second states;
   a pulse modulation module to generate a first pulse train for the first state and a second pulse train for second state, wherein the first and second pulse trains comprise different characteristics;
   a driver coupled to the pulse modulation module to transmit the first and second pulse types across a voltage barrier;
   a receiver coupled to the voltage barrier; and
   a pulse detector coupled to the receiver to demodulate the first and second pulse trains to recover the input data stream in an output data stream; and
   a signal integrity module to detect a lack of pulses received or transmitted for the first and second pulse train types corresponding to a fault condition, wherein the integrated circuit is configured to recover from a glitch on the received pulses using one of the received refresh pulses, and wherein a time to recover from the glitch is different depending upon whether the glitch occurs during the first state or the second state.

68. The digital isolator integrated circuit package according to claim 67, wherein the integrated circuit is further configured to set a glitch timeout to detect a fault condition.

69. The digital isolator integrated circuit package according to claim 67, wherein the integrated circuit is further configured to set a signal integrity timeout to detect a lack of received pulses correspond to a fault condition.

70. The digital isolator integrated circuit package according to claim 67, wherein the signal isolator includes a magnetic field sensing element.

71. The digital isolator integrated circuit package according to claim 70, wherein the magnetic field sensing element comprises a magnetoresistive element.

72. A digital isolator integrated circuit package, comprising:
   a first input to receive an input data stream having first and second states;

a pulse modulation module to generate a first pulse train for the first state and a second pulse train for second state, wherein the first and second pulse trains comprise different characteristics;

a driver coupled to the pulse modulation module to transmit the first and second pulse types across a voltage barrier;

a receiver coupled to the voltage barrier; and a pulse detector coupled to the receiver to demodulate the first and second pulse trains to recover the input data stream in an output data stream; and a signal integrity module to detect a lack of pulses received or transmitted for the first and second pulse train types corresponding to a fault condition, wherein the integrated circuit is further configured to set a glitch timeout to detect a fault condition.

73. The digital isolator integrated circuit package according to claim 72, wherein the integrated circuit is further configured to set a signal integrity timeout to detect a lack of received pulses correspond to a fault condition.

74. The digital isolator integrated circuit package according to claim 72, wherein the signal isolator includes a magnetic field sensing element.

75. The digital isolator integrated circuit package according to claim 74, wherein the magnetic field sensing element comprises a magnetoresistive element.

76. A digital isolator integrated circuit package, comprising:

a first input to receive an input data stream having first and second states;

a pulse modulation module to generate a first pulse train for the first state and a second pulse train for second state, wherein the first and second pulse trains comprise different characteristics;

a driver coupled to the pulse modulation module to transmit the first and second pulse types across a voltage barrier;

a receiver coupled to the voltage barrier; and a pulse detector coupled to the receiver to demodulate the first and second pulse trains to recover the input data stream in an output data stream; and a signal integrity module to detect a lack of pulses received or transmitted for the first and second pulse train types corresponding to a fault condition, wherein the integrated circuit is further configured to set a signal integrity timeout to detect a lack of received pulses correspond to a fault condition.

77. The digital isolator integrated circuit package according to claim 76, wherein the signal isolator includes a magnetic field sensing element.

78. The digital isolator integrated circuit package according to claim 76, wherein the magnetic field sensing element comprises a magnetoresistive element.

79. A digital isolator integrated circuit package, comprising:

a first input to receive an input data stream having first and second states;

a pulse modulation module to generate a first pulse train for the first state and a second pulse train for second state, wherein the first and second pulse trains comprise different characteristics;

a driver coupled to the pulse modulation module to transmit the first and second pulse types across a voltage barrier;

a receiver coupled to the voltage barrier; and a pulse detector coupled to the receiver to demodulate the first and second pulse trains to recover the input data stream in an output data stream; and a signal integrity module to detect a lack of pulses received or transmitted for the first and second pulse train types corresponding to a fault condition, wherein the signal isolator includes a magnetic field sensing element.

80. The digital isolator integrated circuit package according to claim 79, wherein the magnetic field sensing element comprises a magnetoresistive element.

\* \* \* \* \*

UNITED STATES PATENT AND TRADEMARK OFFICE
CERTIFICATE OF CORRECTION

PATENT NO. : 10,142,052 B2
APPLICATION NO. : 15/909178
DATED : November 27, 2018
INVENTOR(S) : Alejandro Gabriel Milesi et al.

It is certified that error appears in the above-identified patent and that said Letters Patent is hereby corrected as shown below:

In the Specification

Column 5, Line 65, delete "In embodiment," and replace with --In embodiments,--.

Column 6, Line 4, delete "It other" and replace with --In other--.

Column 7, Line 28, delete "shows in" and replace with --shown in--.

Column 8, Line 31, delete "to a side" and replace with --to as side--.

In the Claims

Column 11, Line 35, delete "steam" and replace with --stream--.

Column 13, Line 17, delete "steam" and replace with --stream--.

Column 13, Line 64, delete "steam" and replace with --stream--.

Column 14, Line 41, delete "steam" and replace with --stream--.

Column 15, Line 40, delete "steam" and replace with --stream--.

Signed and Sealed this
Twelfth Day of March, 2019

Andrei Iancu
*Director of the United States Patent and Trademark Office*